(12) United States Patent
Létourneau et al.

(10) Patent No.: US 7,797,823 B2
(45) Date of Patent: Sep. 21, 2010

(54) HIGH DENSITY COMPONENT ASSEMBLY METHOD AND APPARATUS

(75) Inventors: Fabien Létourneau, Gatineau (CA); Stefano DeCecco, Ottawa (CA); Peter Serjak, Ottawa (CA)

(73) Assignee: Alcatel Lucent, Paris (FR)

( * ) Notice: Subject to any disclaimer, the term of this patent is extended or adjusted under 35 U.S.C. 154(b) by 177 days.

(21) Appl. No.: 11/967,756

(22) Filed: Dec. 31, 2007

(65) Prior Publication Data

US 2009/0168348 A1 Jul. 2, 2009

(51) Int. Cl.
*H05K 3/30* (2006.01)
(52) U.S. Cl. ............... 29/832; 29/830; 29/739; 29/740; 29/25.35; 29/25.42; 310/358; 310/360; 310/362; 310/363; 310/365; 333/193; 333/194; 333/195

(58) Field of Classification Search ..... 29/25.25–25.42, 29/830, 832, 739, 740; 310/358–365; 333/193–195
See application file for complete search history.

(56) References Cited

U.S. PATENT DOCUMENTS

| 6,781,833 | B2* | 8/2004 | Lu ............................ 361/695 |
| 7,536,781 | B2* | 5/2009 | Cromwell ..................... 29/832 |
| 2008/0018353 | A1* | 1/2008 | Thamarayoor .............. 324/765 |

* cited by examiner

*Primary Examiner*—Derris H Banks
*Assistant Examiner*—Azm Parvez
(74) *Attorney, Agent, or Firm*—Wall & Tong, LLP

(57) ABSTRACT

Apparatus and method for providing high density component assemblies, such as electromechanical or electro-optical assemblies.

16 Claims, 3 Drawing Sheets

HIGH DENSITY COMPONENT ASSEMBLY METHOD AND APPARATUS

FIELD OF THE INVENTION

The present invention relates to apparatus and method for providing high density component assemblies, such as electromechanical or electro-optical assemblies.

BACKGROUND OF THE INVENTION

In a manufacturing environment it is often necessary to produce assemblies or subassemblies including electromechanical components. It is further desirable to increase the number of electromechanical components assembled within a given volume or surface area (i.e., increase the "density").

In various applications, such as telecommunications applications, printed circuit boards (PCBs) are generally cooled by a fan assembly including multiple fans or other cooling devices. Typically, a chassis or enclosure includes PCB assemblies (e.g., revenue-generating circuit cards) providing various functions as well as a fan assembly for cooling purposes. The available chassis space must support the mounting of fans, the mounting of electronic controls associated with the fans and the mounting of the PCB assemblies providing various functions. Where the amount of chassis space necessary to support the cooling function is larger than desirable, the number of fans must be reduced or the number of functions must be reduced.

When opting for fewer fans, the cooling capacity of the fan assembly is reduced or expensive components such as heat sinks are needed. When opting to use more space for the fan assembly, the number of PCB assemblies such as revenue-generating circuit cards is reduced.

SUMMARY

Various deficiencies of the prior art are addressed by embodiments of apparatus and method for providing high density component assemblies, such as electromechanical or electro-optical assemblies.

In one embodiment, a method of assembling comprises: positioning a plurality of components upon a stiffening member, the stiffening member having guide tabs formed thereon to receive the components in an aligned manner; positioning, upon the plurality of components, a printed circuit board (PCB); securing the PCB to the plurality of components via a first set of fasteners to form thereby an initial assembly; repositioning the initial assembly; and securing the stiffening member to the plurality of components via a second set of fasteners to form thereby a final assembly.

BRIEF DESCRIPTION OF THE DRAWINGS

The teachings of the various embodiments can be readily understood by considering the following detailed description in conjunction with the accompanying drawings, in which.

To facilitate understanding, identical reference numerals have been used, where possible, to designate identical elements that are common to the figures.

DETAILED DESCRIPTION OF THE INVENTION

The various embodiments will be primarily described within the context of an assembly in which a plurality of electromechanical components (e.g., fans) are secured to a printed circuit board using a stiffening member such that increased component density is provided without a loss in mechanical strength of the assembly. It will be appreciated by those skilled in the arts and informed by the teachings herein that the invention is broadly applicable to any apparatus or assembly in which increased component density without loss of mechanical strength is desired.

Figure 1:
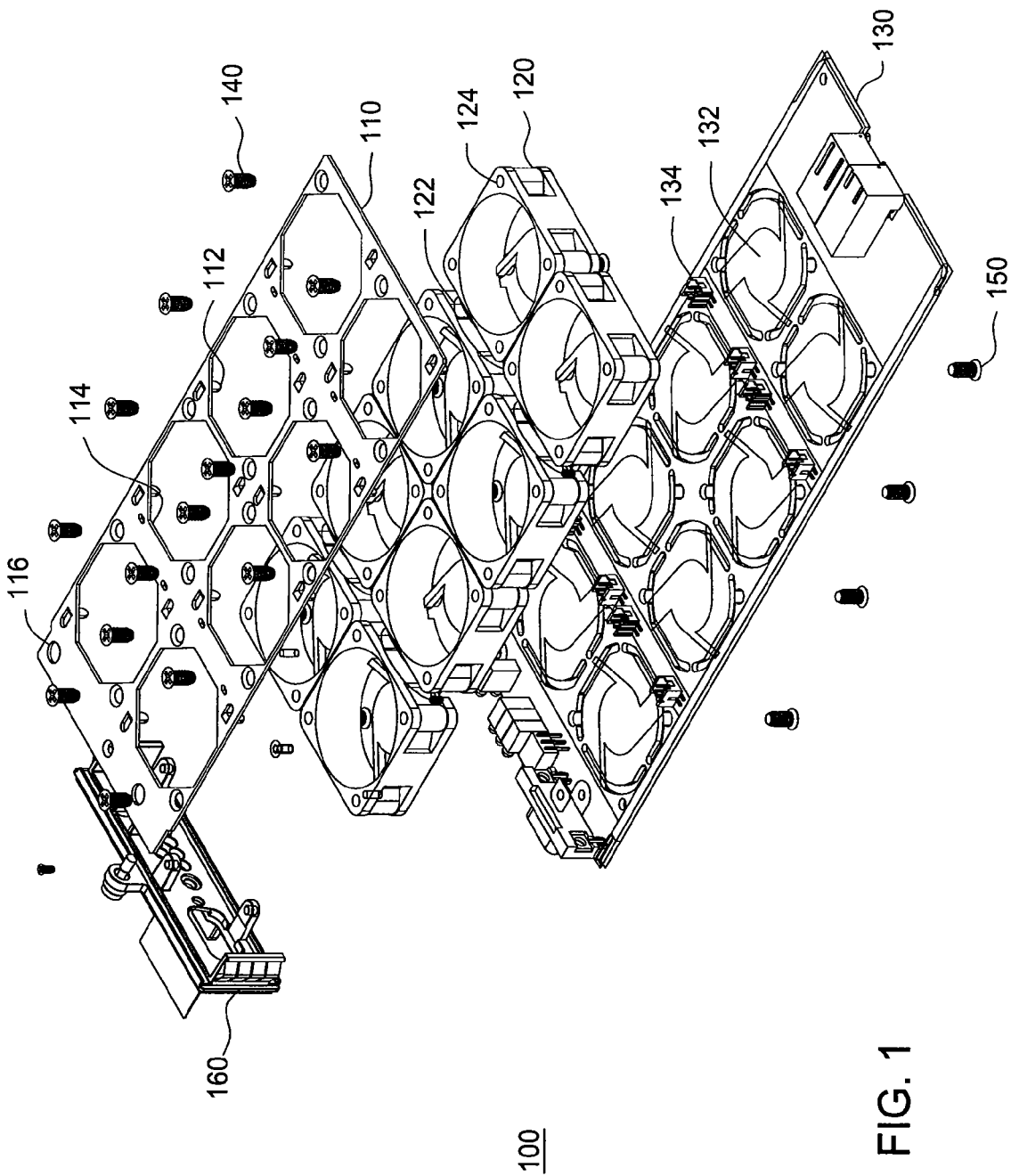
FIG. 1 depicts an exploded view of a fan assembly useful in understanding the present invention.

FIG. 1 depicts an exploded view of a fan assembly useful in understanding the various embodiments. Specifically, the fan assembly 100 of FIG. 1 comprises a stiffening member 110, plurality of fans 120, printed circuit board (PCB) 130, first set of fasteners 140, second set of fasteners 150 and face plate 160.

The fan assembly 100 of FIG. 1 is depicted as including eight fans disposed between the stiffening member 110 and PCB 130. The first set of fasteners 140 secures the stiffening member 110 to the plurality of fans 120. The second set of fasteners 150 secures the PCB 130 to the plurality of fans 120. The face plate 160 is secured to one end of the resulting subassembly. In operation, a plurality of fans 120 urge air through corresponding apertures in the stiffening member 120 and PCB 130. In one embodiment, the apertures within the PCB 130 are defined by corresponding PCB cutout regions (i.e., punchouts) 132, which regions break in a controlled manner under mechanical pressure such as at the end of an assembly process.

The fasteners may comprise self-tapping screws, non-self-tapping screws, rivets, nails and the like (in a fastener capable of securing the PCB 130 and stiffening member 110 to the plurality of fans 120. More generally, the type of fasteners selected is dictated by the type of component to be secured. Thus, while a self-tapping screw may be appropriate where the components are fans, a different type of fastening means may be appropriate for other mechanical components, electromechanical components, electro-optic components or optical components. In these cases, fastening may be accomplished via adhesives, ultrasonic or other welding techniques and so on. In one embodiment, components are "snap in" components in which the mechanical attributes of the components include mechanical fastening means which mate directly to the PCB 130 or stiffening member 110. The one or more components are disposed between the PCB-like element and the stiffening member element. In one embodiment, components are fastened using long screws that thread into a matching threaded fastener receiver on the stiffening member).

The PCB 130 as described herein comprises a printed circuit board manufactured in a standard manner. It will be appreciated that the functional element denoted as PCB 130 may in fact be constructed as something other than a traditional PCB. For example, in various embodiments, the PCB 130 comprises a plastic, metal or other substantially planar structure including appropriate mounting and/or electrical/optical component termination means.

Each fan within the plurality of fans 120 is depicted as a substantially square fan having approximate dimensions of approximately "40 mm" by "40 mm×" with the depth of "15 mm". Each fan is depicted as including an electrical wiring harness 122 which cooperates with a corresponding connector 134 mounted on the PCB 130. Each corner of each fan is depicted as including a mounting hole or aperture adapted to receive a fastener to enable the fans to be mounted thereby to the stiffening member 110 and PCB 130. The fans can be mounted on the PCB 130 directly or held away with standoffs or similar means.

Figure 2:
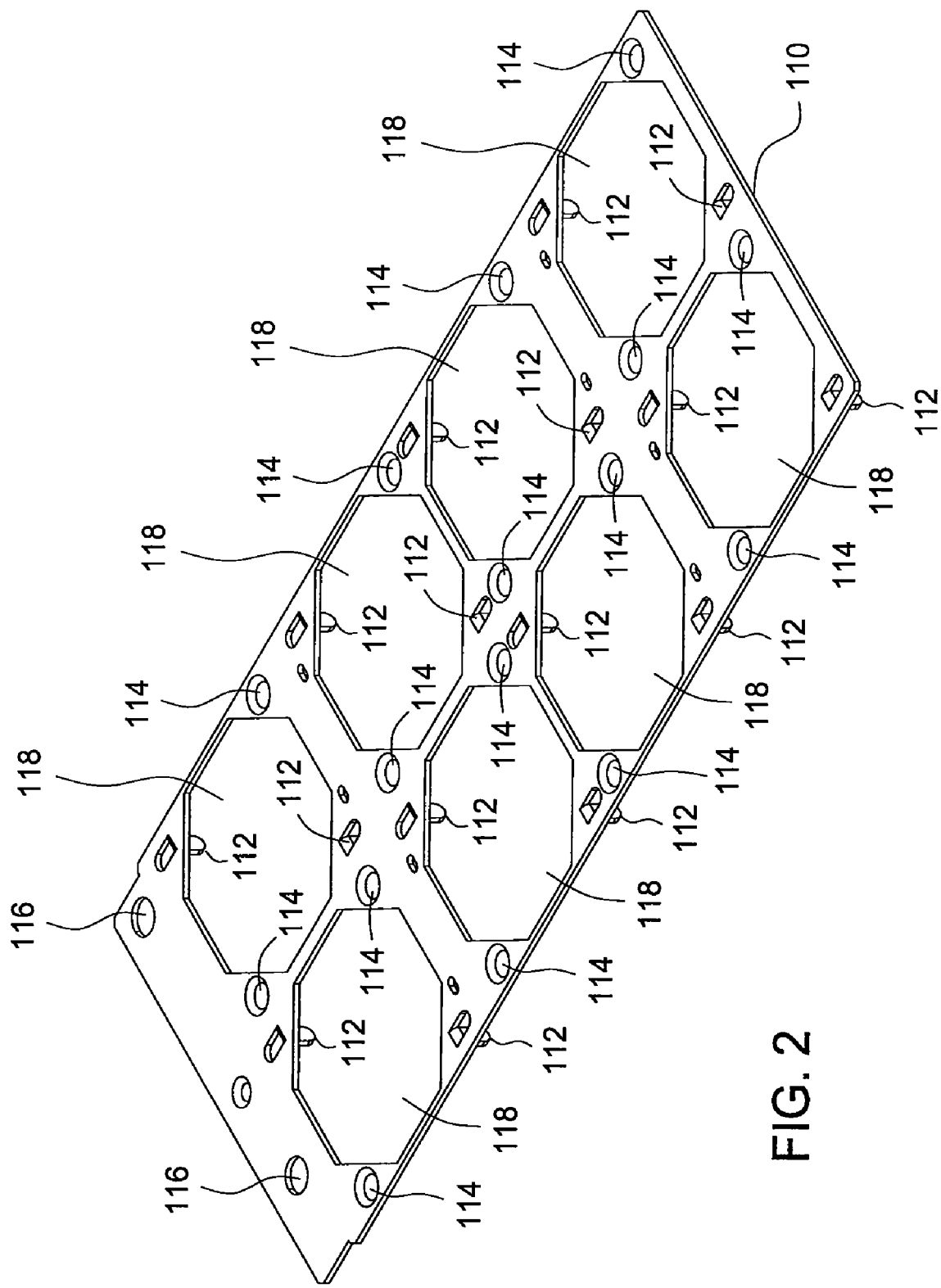
FIG. 2 depicts an orthogonal view of a stiffening member suitable for use in the fan assembly of FIG. 1.

FIG. 2 depicts an orthogonal view of a stiffening member suitable for use in the fan assembly of FIG. 1. Specifically, the stiffening member 110 of FIG. 2 comprises a substantially planar rigid material (e.g., metal, plastic or suitable materials) having a plurality of apertures (illustratively eight) adapted to provide fluid cooperation with airflow induced by fans to which the stiffening member is intended to be fastened. Each of the airflow apertures 118 has disposed about it one or more sub-apertures or holes disposed in a manner mechanically aligned with the mounting holes 124 of a corresponding fan such that a screw or other fastener may be used to secure the fan to the stiffening member. One or more of the sub-apertures or holes is associated with a respective tab 112, such that the stiffening member 110 may be aligned with a plurality of fans 120 using the stiffening member tabs 112 and fan mounting holes 124. One or more of the sub-apertures or holes is associated with a respective mounting aperture 114 adapted to receive therethrough a fastener such that the stiffening member 110 may secured to the plurality of fans 120.

Figure 3:
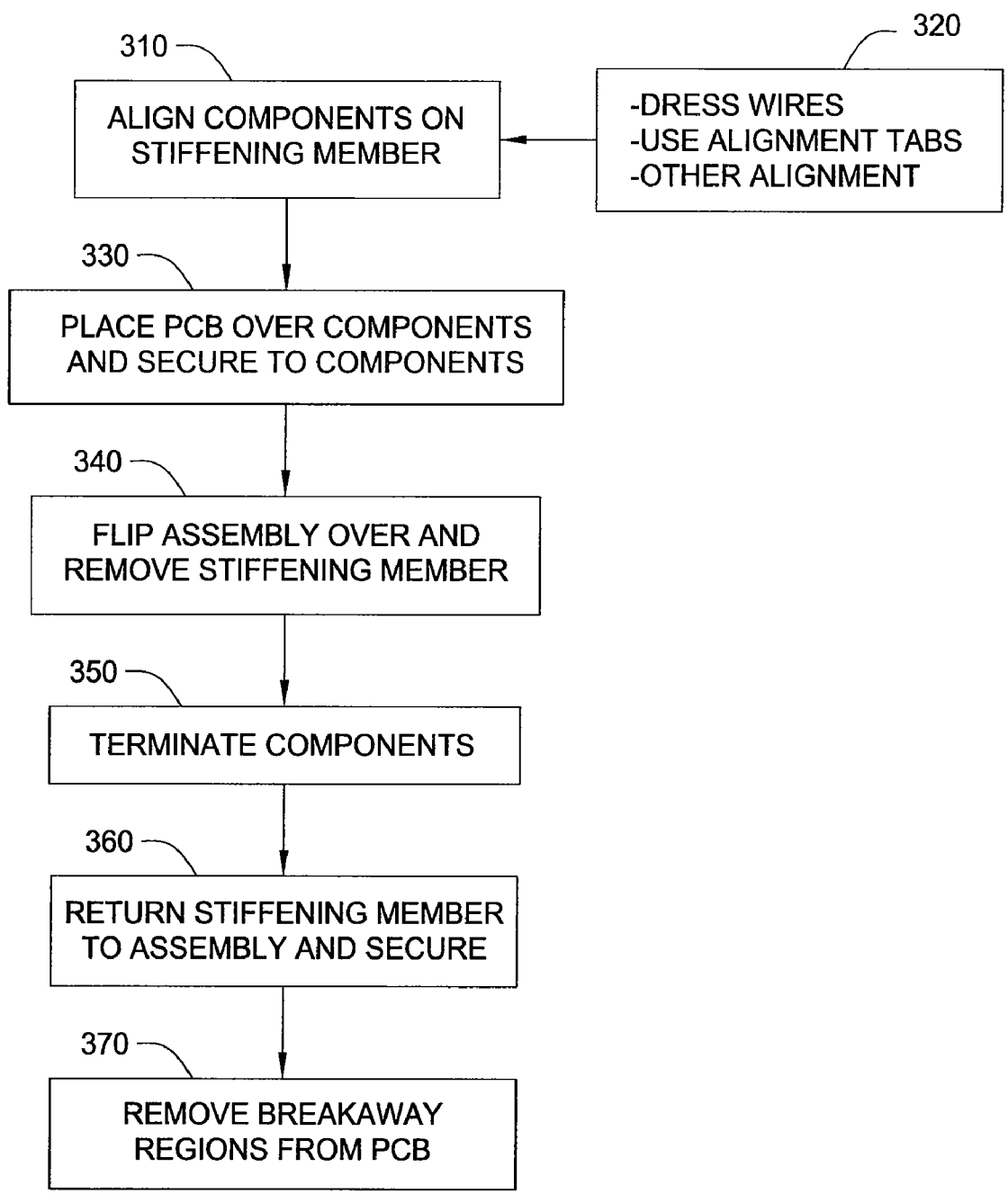
FIG. 3 depicts a flow diagram of a method according to an embodiment.

FIG. 3 depicts a flow diagram of an assembly method according to one embodiment. The assembly method 300 of FIG. 3 will be discussed in conjunction with the fan assembly depicted above with respect to FIG. 1.

At step 310, the electromechanical components associated with the assembly are aligned on the stiffening member 110. That is, referring to FIG. 1, the stiffening member 110 is placed in a tab-up orientation such as on a work surface. Each of the plurality of fans 120 is then placed upon its respective portion of the stiffening member 110 by aligning the stiffening member tabs 112 and fan mounting holes 124. Optionally, referring to box 320, the fan electrical wiring harnesses 122 may be adjusted or "dressed" or other alignment procedures may be invoked.

At step 330, the PCB 130 is placed over and secured to the electromechanical or electro-optical components. That is, referring to FIG. 1, the PCB 130 is placed over the plurality of fans 120 and secured to the plurality of fans via the second set of fasteners 150.

At step 340, the assembly is flipped over and in the stiffening member is removed. It is noted that this must be done carefully where the stiffening member 110 is not yet fastened to the electromechanical components 120. That is, referring to FIG. 1, the assembly provided thus far is flipped over such that the PCB 130 is resting on the work surface. Additionally, the stiffening member 110 is lifted from the plurality of fans 120.

At step 350, electromechanical components are terminated. That is, referring to FIG. 1, the fan electrical wiring harnesses 122 are coupled to corresponding connectors 134 on the PCB 130.

At step 360, the stiffening member 110 is returned to its previous position in the assembly and secured. Referring to FIG. 1, the stiffening member 110 is returned to its previous position with respect to the plurality of fans 120 (i.e., tab-aligned with fan mounting holes) and secured to the plurality of fans via the first set of fasteners 140.

At step 370, any breakaway regions are removed from the PCB 130. Referring to FIG. 1, the breakaway regions 132 cut or punched into the PCB 130 are removed (i.e., punched out entirely) so that the fans 120 may urge airflow through the PCB 130.

Optionally, additional fasteners are passed through a mounting aperture 116 within the stiffening member 110 to secure thereby the face plate 160.

The apparatus and methods described above with respect to the various figures depict the stiffening member 110 operative as both a stiffening member within an assembly as well as a jig used in forming the assembly. The stiffening member may also include visual aids useful in the assembly process. For example, the stiffening member may include visual aids useful in orienting the fan electrical wiring harnesses 122, the plurality of fans 120 or other electromechanical components and so on. Referring to FIG. 2, it is noted that the PCB 130 is depicted as including visual indicators useful in enabling proper location/placement of fan components. Other visual indicators are optionally provided to visually indicate proper location/placement of other types of components.

For example, step 310 of the method 300 of FIG. 3 depicts the use of the stiffening member 110 as a jig on which the plurality of fans are precisely laid out in conformance with their assembled position. The PCB 130 is then installed over the fans and secured directly to each fan through the fan mounting holes without a need for female threaded parts such as standoffs or nuts. Advantageously, this operation assembles the plurality of fans in a single orientation, such that there is no need to handle or flip the assembly prior to securing the PCB 132 to the plurality of fans 120 (when all the fans are secured the assembly is flipped once). In this manner, the risk of damaging the assembly or its circuitry is reduced.

The assembly aid (jig) is then secured to the fans on the opposite surface of the fans, again using the same type of hardware and without the need for a female fastener, thereby securing directly into the fan's mounting locations. This apparatus and method provides a sandwich construction; namely, a solution that increases the moment of inertia of the fan card assembly, optimizing its strength and significantly increasing the overall assembly's stiffness. The use of the stiffening member as a jig/stiffener prevents the fan electrical harnesses 122 from moving, coming loose or possibly getting snagged during handling of the assembly, such as installation within a system chassis. Additionally, the stiffening member is further operative to secure the handle to prevent a bending moment on the PCB that could result in damage to the component and/or internal circuits.

A low cost jig/stiffener design according to the various embodiments delivers a plurality of functions to simplify the assembly process when used as an assembly aid, to jig the fans and keep them in place and to offer visual aid to properly orient the components and reduce assembly errors. Additionally, to act as a stiffener and to provide cable management that allows the design of a highly populated fan card with fan inlet (or outlet) breathing through the PCB to be robust and efficient.

The exploded view of FIG. 1 shows the density of the space occupied by the plurality of fans over the PCB overall area. It is apparent from the view that such a PCB is very prone to being damaged due to the large openings into the board. This weakened PCB has high probability of being damaged if each fan was to be secured to the PCB one after another requiring the assembler to flip the assembly front to back each time. The jig/stiffener incorporates in its design alignment tabs and visual aids to orient, align and pre-group all the fans such that the PCB is lowered over the fans and all secured at once, eliminating handling the PCB and flipping the assembly each time a fan is secured.

Once secured, the jig is temporally removed if necessary to complete the connection and dress the wires between the fans (all fans may be processed at one time such that for this purpose no additional flipping/handling of the initial assembly is needed). The jig/stiffener is then installed over the fans and secured in place ensuring cable management is maintained and providing sought for rigidity to the overall assembly. Embodiments of the solution described here also use the jig/stiffener to secure the faceplate, thus eliminating bending of the PCB during handling, insertion and/or extraction operations which could result in PCB damage. In various embodiments, the rear end of the jig/stiffener is connected directly, or through hardware such as standoffs, to further strengthen the rear end (connector end) of the PCB.

Advantageously, the invention makes possible a very high electromechanical component density (e.g., fans per PCB area) for a PCB mounted assembly. The high risk of damage resulting from standard assembly techniques is reduced using the apparatus, methods and techniques discussed herein. In addition, expensive assembly jigs and the requirement to use specific tools are avoided. The plurality of functions offered by this part facilitates assembly, reduces errors, minimizes damage during assembly by reducing the amount of handling and increases the overall strength of the completed assembly to a level expected by those handling these units and similar equipment. All of these features are made available at little or no incremental assembly cost when compared to an add-on stiffener (e.g., a plate with holes attached to an assembly to fight additional stiffness).

The various embodiments provide assembly aids (alignment tabs and visual aids) as well as being an integral part of the completed assembly ensuring increased stiffness of the product. All of these features allow a designer to drastically increase the number of fans that can be used on a PCB that is practically the same size in area as the combined fans.

The use of such an assembly techniques is extremely useful within the context of relatively small products/components that require as much cooling capacity as possible within a small form factor. However, the assembly techniques may also be scaled up for use with larger products/components.

While the foregoing is directed to various embodiments of the present invention, other and further embodiments of the invention may be devised without departing from the basic scope thereof. As such, the appropriate scope of the invention is to be determined according to the claims, which follow.

What is claimed is:

1. A method of assembling, comprising:
   positioning a plurality of components upon a stiffening member, the stiffening member having guide tabs formed thereon to receive the components in an aligned manner;
   positioning, upon the plurality of components, a printed circuit board (PCB);
   securing the PCB to the plurality of components via a first set of fasteners to form thereby an initial assembly;
   repositioning the initial assembly;
   removing the stiffening member from the plurality of components;
   terminating the components to the PCB; and
   securing the stiffening member to the plurality of components via a second set of fasteners to form thereby a final assembly.

2. The method of claim 1, wherein the components comprise electrical components and the step of terminating comprises providing an electrical connection between the PCB and the electrical components.

3. The method of claim 2, wherein the components comprise fans.

4. The method of claim 1, wherein the components comprise electromechanical components.

5. The method of claim 1, wherein the components comprise electro-optical components.

6. The method of claim 1, wherein the PCB has formed therethrough a plurality of apertures adapted to cooperate with mounting portions of the plurality of components, said first set of fasteners being coupled to the component mounting portions via cooperating apertures.

7. The method of claim 1, wherein the components comprise fans and the PCB has formed therethrough a plurality of punchouts adapted to form apertures supporting airflow from the fans.

8. The method of claim 7, further comprising:
   removing the punchouts from the PCB to provide thereby the airflow supporting apertures.

9. The method of claim 1, wherein said positioning is performed in accordance with visual component position indicators disposed upon the PCB.

10. Apparatus supporting high density component assembly, comprising:
    a stiffening member having guide tabs formed thereon to removeably receive a plurality of components in an aligned manner; and
    the stiffening member further comprising a first plurality of apertures aligned with proximate component mounting portions to receive therethrough a first plurality of fasteners to secure a PCB positioned upon and terminable to the plurality of components, the stiffening member adapted to be coupled to the plurality of components via a second set of fasteners.

11. The apparatus of claim 10, wherein:
    the stiffening member is fastened to a plurality of components disposed between the stiffening member and a printed circuit board (PCB).

12. The apparatus of claim 11, further comprising:
    the plurality of components are removeably received by the stiffening member and
    disposed between the stiffening member and PCB to form thereby an initial assembly.

13. The apparatus of claim 12, further comprising the second set of fasteners for securing the stiffening member to the plurality of components.

14. The apparatus of claim 12, wherein:
    the initial assembly being repositionable in a manner to disengage the stiffening member from the plurality of components to enable thereby respective electrical connections between the plurality of components and the PCB.

15. The apparatus of claim 10, wherein the components comprise one or more of electrical components, electromechanical components and electro-optical components.

16. The apparatus of claim 10, wherein the components comprise fans.

* * * * *